United States Patent [19]

Funk

[11] 4,080,568

[45] Mar. 21, 1978

[54] ENERGY MONITORING DEVICE

[75] Inventor: Laurence L. Funk, Hillsborough, N.C.

[73] Assignee: Roy B. Fitch, Jr., Carrboro, N.C.

[21] Appl. No.: 696,130

[22] Filed: Jun. 14, 1976

[51] Int. Cl.² ............................................. G01R 21/06
[52] U.S. Cl. .................................. 324/142; 364/483; 364/464
[58] Field of Search ................ 324/142; 235/151.21, 235/151.31

[56] References Cited

U.S. PATENT DOCUMENTS

| 2,039,863 | 5/1936 | Williams | 324/142 UX |
| 3,655,955 | 4/1972 | Brendle | 324/142 UX |
| 3,953,795 | 4/1976 | Brunner et al. | 324/142 |
| 3,961,257 | 6/1976 | Milkovic | 324/142 |

Primary Examiner—Stanley T. Krawczewicz
Attorney, Agent, or Firm—Cushman, Darby & Cushman

[57] ABSTRACT

The monitoring of energy consumed in a single phase, three wire electrical system is accomplished by generating a voltage proportional to the current flowing in the system, which is conveyed to a linear voltage controlled oscillator by a single electrical conductor. A waveform derived by a counter from timing pulses provided by an electronic clock circuit gates the output of the VCO to a counter, and also provides for alternation of a display between a representation of energy consumed and time of day. Selective adjustment of the voltage to frequency converting circuit's gain provides an output indication in appropriate electrical or monetary units. All gating and resetting of counters, display multiplexing and timekeeping functions are provided by the electronic clock circuit.

5 Claims, 4 Drawing Figures

ENERGY MONITORING DEVICE

STATEMENT OF PRIOR ART

Heretofore measurements of units representative of the amounts of power consumed in 3-wire single phase systems have generally been performed by complicated, and expensive instruments. By nature of their being mounted externally to habitations, and their having calibrations not easily understood by lay persons, however, they have never been instrumental in allowing such persons to satisfactorily evaluate and hence, effectively control their usage of electrical energy.

Recently, digital electronic power and energy meters have been devised as noted in the referenced patents but their complexity precludes to an extent greater than that of the present invention their household use by lay persons, not only in that they are necessarily expensive but also that they are difficult to install due to their having a plurality of lines connecting the sensor transformers to the body of the meter.

BRIEF STATEMENT OF THE INVENTION

It is the object of the present invention therefore to provide a simple and straightforward conversion from a sample of the current flowing in a 3-wire single phase power system to a string of digital pulses the frequency of which is functionally related to said sample.

It is a further object of the invention to provide the count of these pulses in a form which the lay person can readily appreciate, either in electrical units or in monetary ones.

It is a further object of the invention to utilize an electronic clock integrated circuit to provide not only a time display function which may be useful in conjunction with the energy monitor function, but also to provide all timebase, counter gating and resetting, and display multiplexing functions, thereby abrogating the requirement to provide these functions in a separate embodiment.

It is a still further object of the invention to provide an embodiment whereby means is provided that facilitates interconnection between sensor transformers for a 3-wire system and monitor by only one electrical conductor.

DRAWINGS

DESCRIPTION OF THE PREFERRED EMBODIMENT

Figure 1:
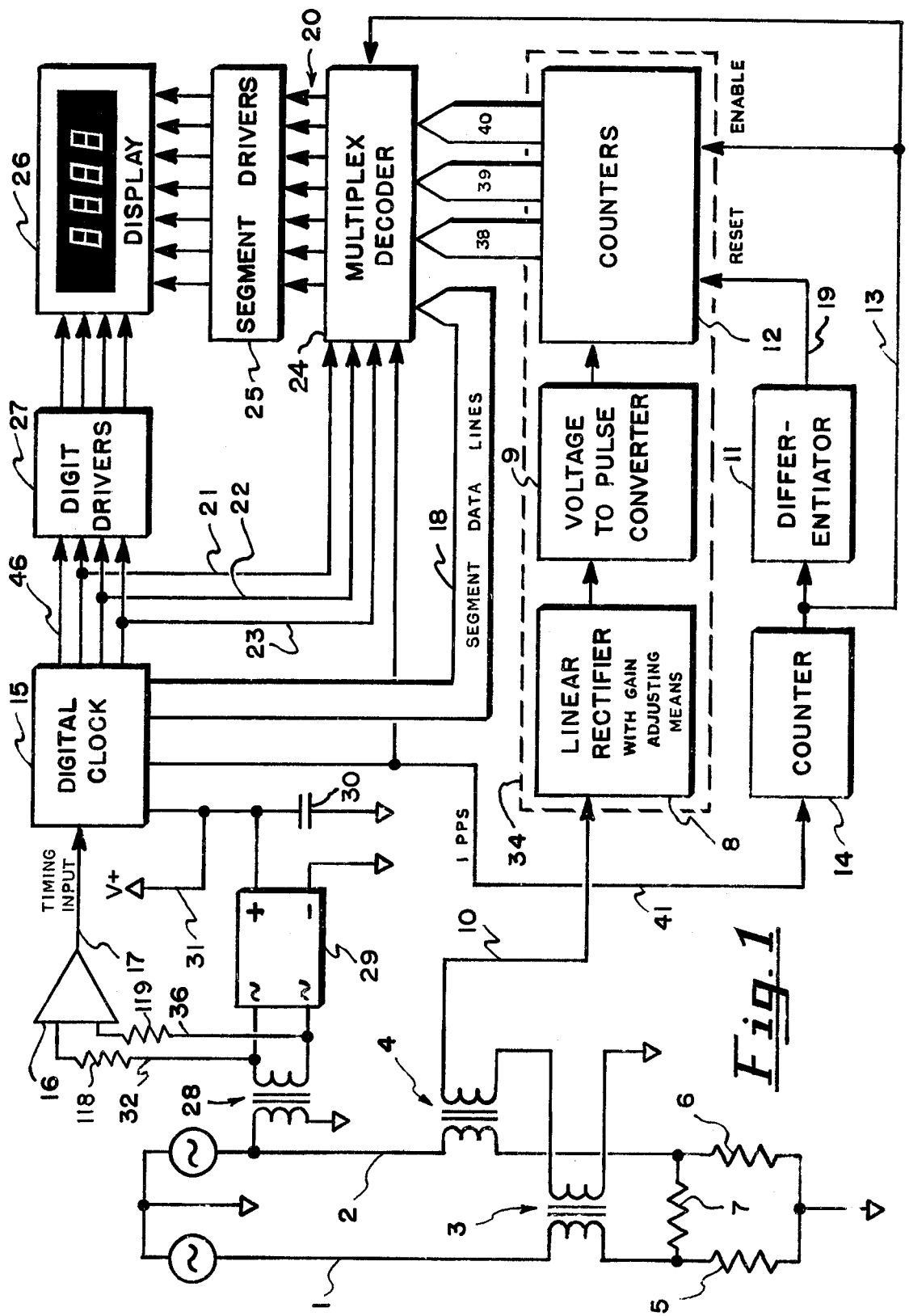
FIG. 1 is a block diagram showing the interconnections between various components comprising apparatus for metering current in a 3-wire single phase system.

The invention measures current in 2 active wires of a 3-wire system and thereby arrives at a representation of the energy being dissipated in the system during a measurement period T. Referring to FIG. 1, current flowing in wire 1 to ground through load resistor 5 is measured by current transformer 3 and likewise current flowing in wire 2 through load resistor 6 is measured by current transformer 4. In addition, current flowing through load resistor 7 is measured by both current transformers 3 and 4. Thus the current sample is represented as $i_5 + i_6 + 2i_7$. Since in this application the voltages of the system are not considered to drop significantly due to loads, i.e., the source impedance is minimal, energy dissipated by the system in the measurement period T can be seen thusly:

$$E = k(V_5 i_5 + V_6 i_6 + V_5 i_7 + V_6 i_7)T$$
$$= kV(i_5 + i_6 + 2i_7)T,$$

since the energy dissipated in load resistor 7 is $ki_7(V_5 + V_6)$ and $V_5 = V_6$, V and T are fixed constants, and k is a fixed one, so the variable is the measured value.

Figure 2:
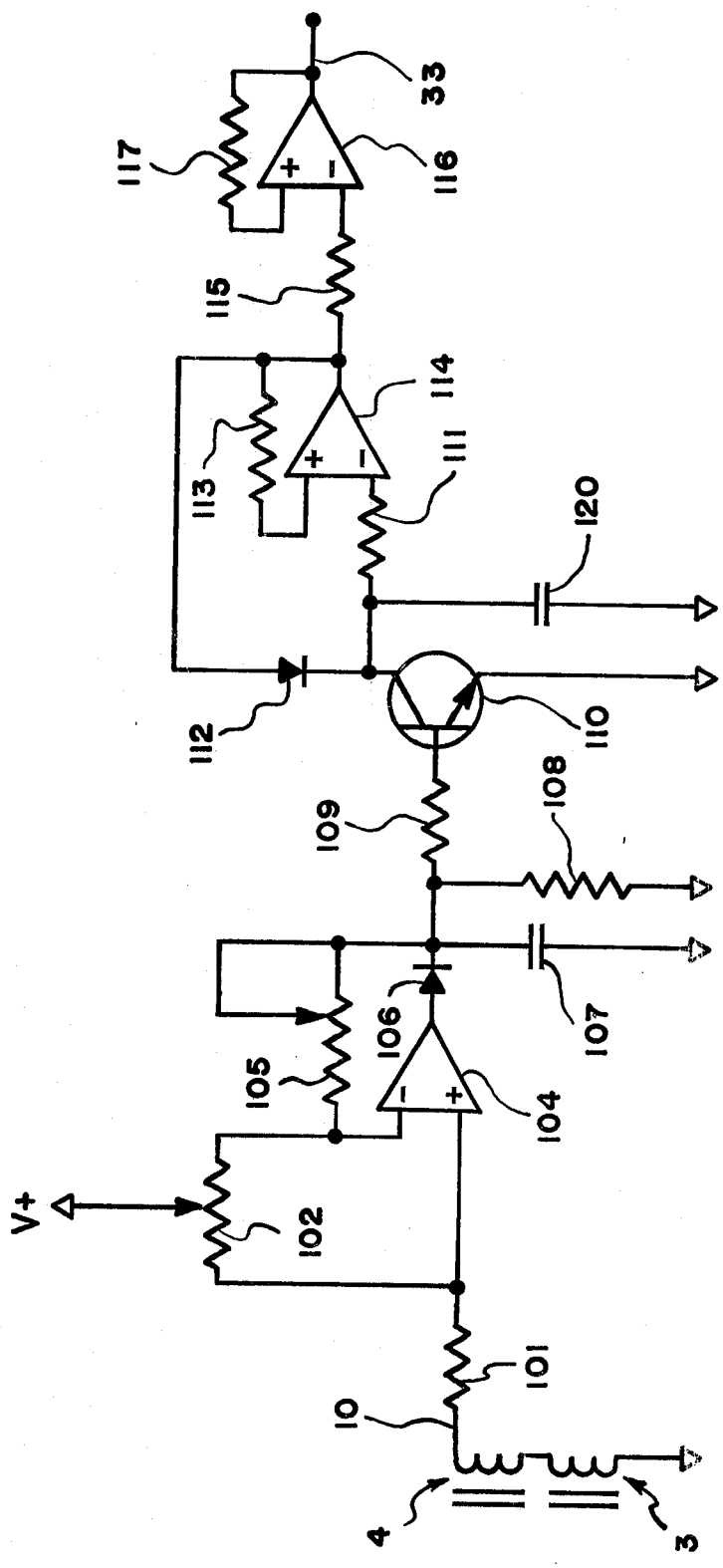
FIG. 2 illustrates in detail the elements comprising the analog to pulse conversion circuits, the block numbered 34 in FIG. 1.

Current transformers 3 and 4 are of low impedance, but they feed a high impedance 101 in FIG. 2, through line 10. If these sensor transformers fed a matched impedance they would serve as current sources, and their signals would not have been additive. A mismatched impedance however makes them voltage sources described by $$Z_{ct1}i + Z_{ct2}i = R101\, i + V_{bias}.$$

Due to the linear nature of the resistor 101, current through it into non-inverting input of operational amplifier 104 is proportional to instantaneous power flowing through the system in one phase of the signal cycle. Variable resistor 102 serves to set output of amplifier 104 and diode 106 to just the voltage at which transistor 110 starts to conduct, and variable resistor 105 serves as gain adjusting means by which the present invention may display various engineering or monetary quanta. Capacitor 107, discharged by resistor 108 is charged by diode 106 to approximately the peak level of the output of amplifier 104. That the present invention uses a peak representation rather than an RMS value is not of significance here since the relationship between the two values is a constant. Also, the period T is longer than the period between peaks by a large factor. Current through resistor 109 is proportional to voltage across capacitor 107.

When current through resistor 111 to amplifier 114 falls below the bias level required to keep its output low, due to the linear discharge of capacitor 120 through transistor 110, amplifier 114 switches output state from low to high to fill capacitor 120 very quickly so that current through resistor 111 again forces the output of amplifier 114 low. Resistor 113 provides hysteresis to amplifier 114. Since in charging capacitor 120 the output of amplifier 114 may reach a level insufficient to drive a pulse counter, Schmidt trigger comprising resistors 115 and 117 and amplifier 116 serves as a level shifter and outputs a suitable pulse via line 33.

Power transformer 28, which feeds rectifier 29 and filter capacitor 30, also feeds amplifier 16 through lines 32 and 36 and resistors 118 and 119 to serve as a timing signal wave source to drive the timing input 17 of clock circuit 15.

Figure 3:
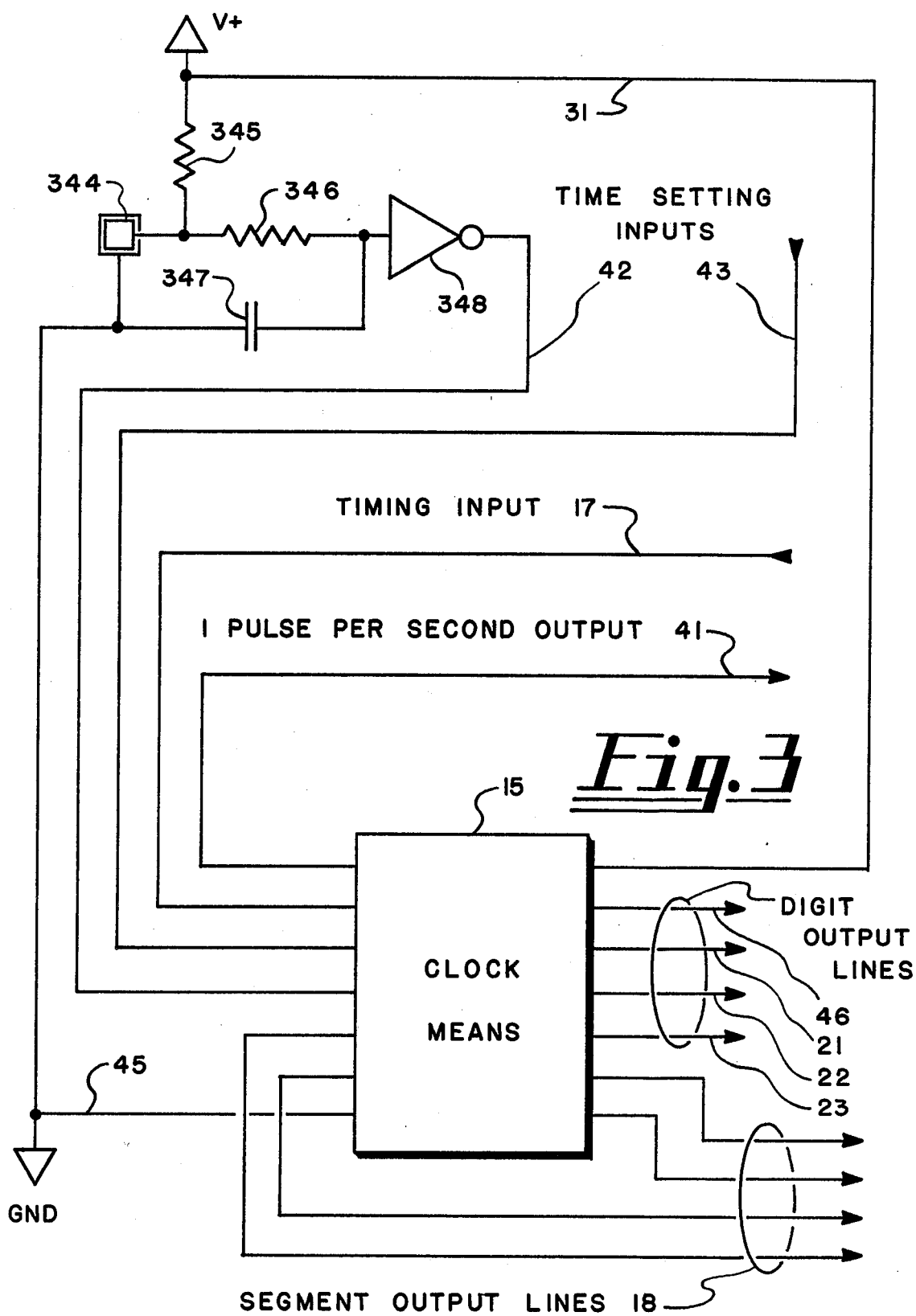
FIG. 3 shows input and output lines required of the digital clock integrated circuit and illustrates circuit to convert signal from an activated touchplate to a signal which may be recognized as valid by the integrated clock circuit for the purpose of setting time function.

FIG. 3 shows the inputs and outputs required of a digital integrated circuit clock 15, such that it may be used for the functions described in Paragraph 3 of BRIEF STATEMENT OF THE INVENTION.

These are limited to fourteen lines, including 2 power supply lines 31 and 45, 2 timesetting lines 42 and 43, a timing input 17, a 1 pulse per second output 41, four coded segment output lines 18, and four digit output lines 46, 21, 22 and 23. Two identical networks comprising a CMOS inverter 348, resistors 345 and 346, capacitor 347 and touchplate 344 replace a mechanical switch for the purpose of providing clock circuit 15 with timesetting signals on lines 42 and 43. Pullup resistor 345 maintains a high level on input of inverter 348, and a protective network comprising resistor 346 and capacitor 347 absorbs static transients that may be induced as a finger at a different floating potential resistively brings input of said inverter low through touchplate 344.

Figure 4:
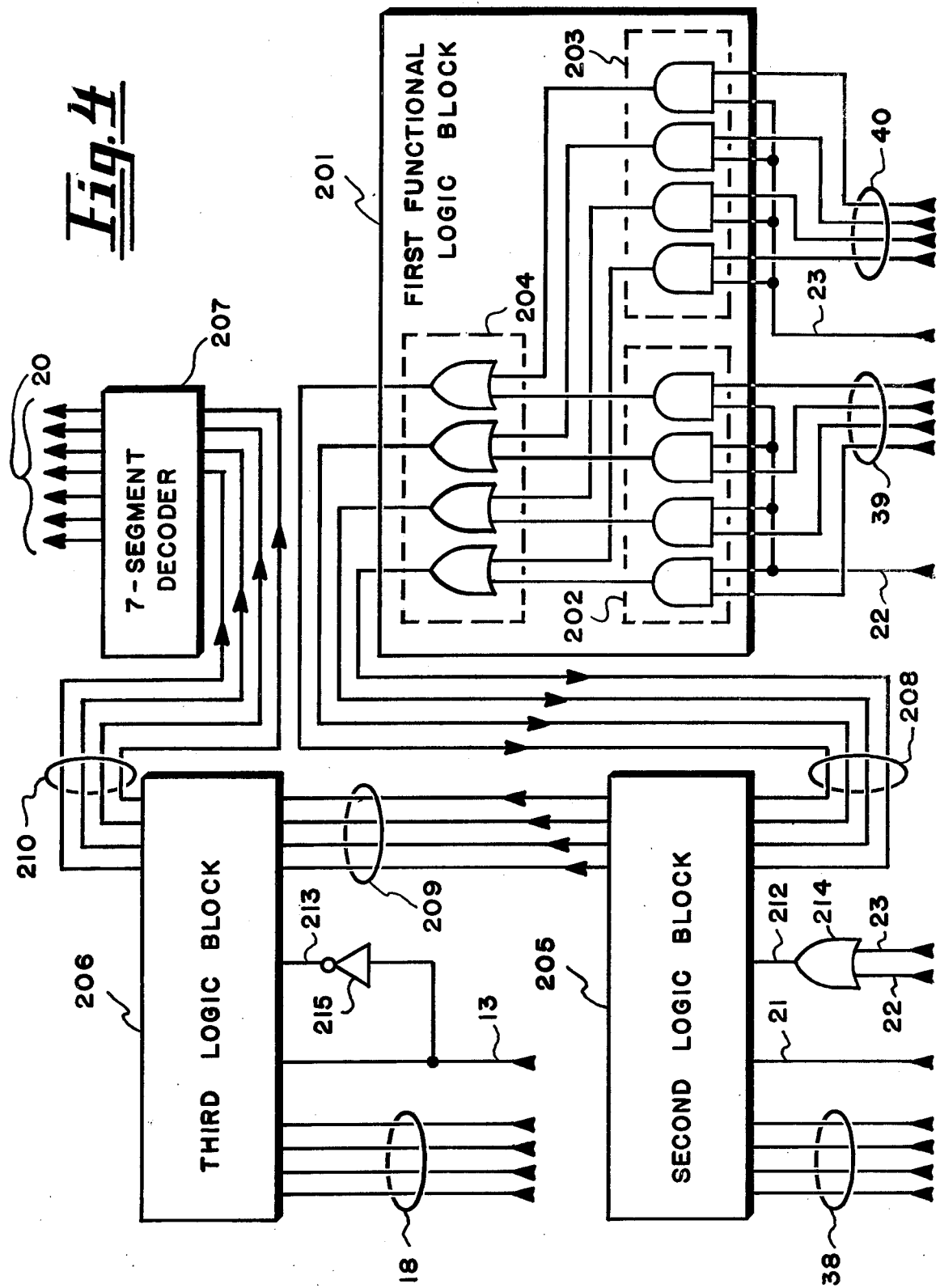
FIG. 4 illustrates in detail the elements comprising the block numbered 24 in FIG. 1 which route counter decades to appropriate display digits.

FIG. 4 is a detailed amplification of the display multiplex decoding logic block 24 in FIG. 1, and comprises in the main part three identical logic blocks 201, 205 and 206 each of which in turn comprise 2 identical quadruple "and" gate blocks 202 and 203 and a quadruple "or" block 204 such that a high signal on control lines 22 and 23, 21 and 212, and 13 and 213 may cause data appearing on pluralities of input lines 39 and 40, 38 and 208, and 18 and 209 to appear on pluralities of lines 208, 209, and 210, respectively. "Or" gate 214 permits data on either lines 39 or 40 to be present on lines 209 whenever 22 or 23 go to a high level. When a control signal on line 13 from counter 14 in FIG. 1 causes the data on plurality of conductors 18 to appear on plurality of conductors 210 the readout 26 displays time of day; and counter bank 12 is enabled to count pulses from network 34 after having been reset by differentiator 11. When said control line 13 shifts to the opposite control level, data on plurality of conductors 209 appears on the plurality of conductors 210, counter bank 12 is frozen at its last count, and as each decade of counter bank 12 is coupled to multiplex decoding block 24 by pluralities of lines 38, 39 and 40, this count is stepped to each readout digit by signals on lines 21, 22 and 23 as these same lines illuminate display digits 26 synchronously and sequentially through a plurality of digit drivers 27. Inverter 215 permits data on pluralities of lines 18 or 209 to be present at the output of block 206. Seven segment decoder 207 translates data on plurality of lines 210 to segment drivers 25, by pluralities of lines 20.

I claim as my invention:

1. A meter for determining and displaying the electrical rate of energy consumption of an electrical system comprising:

means for measuring the current flowing in said system and producing a voltage signal having an amplitude which varies as a function of current flow;

means for amplifying said voltage signal including manually operable means for varying the gain of said amplifying means so as to display said rate in desired units;

means for converting the output of said amplifying means into a pulse train;

first counter means for counting the pulses in said pulse train;

clock means for producing a train of clock pulses;

second counter means for counting said clock pulses and producing a display signal upon a predetermined count;

means for connecting said second counter means to said first counter means to freeze the count within said first counter means upon production of said display signal;

display means for providing a digital display; and means for causing said display to display a number corresponding to the count frozen in said first counter means upon production of said display signal.

2. A meter as in claim 1, wherein said measuring means includes first and second transformers each having a primary winding serially connected to one wire of a three-wire system and a secondary winding serially connected to the other secondary winding and to said amplifying means.

3. A meter as in claim 1, wherein said amplifying means includes an operational amplifier, said varying means includes a variable resistor connected in feedback to said operational amplifier and said converting means includes a diode connected to the output of said operational amplifier for producing a rectified signal, a capacitor connected to said diode for storing the peak valve of said rectified signal and a means for producing a pulse train having a frequency which varies as a function of the value stored on said capacitor.

4. A meter as in claim 1, wherein said display includes a digital display for displaying the cost per unit of time of electricity being currently consumed.

5. A meter as in claim 1, wherein said causing means includes logic means connected between said clock means and said display means and between said first counter means and said display means for alternately connecting said clock means to said display for displaying the time and said first counter means to said display means for displaying the rate of energy consumption.

* * * * *